United States Patent [19]

Shiozawa

[11] Patent Number: 5,621,499
[45] Date of Patent: Apr. 15, 1997

[54] SCANNING EXPOSURE APPARATUS

[75] Inventor: Takahisa Shiozawa, Utsunomiya, Japan

[73] Assignee: Canon Kabushiki Kaisha, Tokyo, Japan

[21] Appl. No.: 492,914

[22] Filed: Jun. 20, 1995

[30] Foreign Application Priority Data

Jun. 22, 1994 [JP] Japan .................................. 6-140174

[51] Int. Cl.$^6$ ................................................ G03B 27/54
[52] U.S. Cl. .......................... 355/67; 355/53; 355/122; 355/50; 359/628; 356/363
[58] Field of Search .......................... 353/122, 85, 38, 353/121, 102; 430/311; 29/829; 355/67, 53, 54, 50, 70

[56] References Cited

U.S. PATENT DOCUMENTS

| | | | |
|---|---|---|---|
| 4,619,508 | 10/1986 | Shibuya et al. ........................ | 353/122 |
| 4,682,885 | 7/1987 | Torigoe ................................... | 355/67 |
| 4,918,583 | 4/1990 | Kudo et al. ............................. | 362/268 |
| 4,974,919 | 12/1990 | Muraki et al. ......................... | 350/6.6 |
| 5,121,160 | 6/1992 | Sano et al. ............................. | 355/53 |
| 5,153,773 | 10/1992 | Muraki et al. ......................... | 359/619 |
| 5,227,862 | 7/1993 | Oshida ................................... | 356/363 |
| 5,251,067 | 10/1993 | Kamon .................................. | 359/628 |
| 5,335,044 | 8/1994 | Shiraishi ................................ | 355/53 |
| 5,345,292 | 9/1994 | Shiozawa et al. .................... | 355/67 |
| 5,459,547 | 10/1995 | Shiozawa .............................. | 355/67 |

Primary Examiner—Arthur T. Grimley
Assistant Examiner—Shival P. Virmani
Attorney, Agent, or Firm—Fitzpatrick, Cella, Harper & Scinto

[57] ABSTRACT

A scanning system includes an illuminating device for illuminating an object with coherent illumination light, and a scanning device for relatively and scanningly moving the object relative to the illumination light, along a scan direction, wherein the illuminating device is arranged so that a direction of interference fringe to be produced on the object by the illumination light is inclined with respect to the scan direction.

19 Claims, 9 Drawing Sheets

— 5,621,499 —

SCANNING EXPOSURE APPARATUS

FIELD OF THE INVENTION AND RELATED ART

This invention relates to a scanning exposure apparatus and a method of manufacturing devices by using such a scanning exposure apparatus. More particularly, the invention is concerned with a scanning exposure apparatus and a device manufacturing method using the same, which is suitably usable for manufacture of microdevices such as semiconductor devices (e.g., ICs or LSIs), liquid crystal devices, image pickup devices (e.g., CCDs) or magnetic heads, for example, and which uses light having coherency for an exposure process.

Referring to FIG. 1 showing a scanning exposure apparatus, denoted in the drawing at 301 is a light source such as an excimer laser, for example, for providing light having high coherency. The light emitted by the light source 301 is shaped by a beam shaping optical system 302 into a suitable sectional size and sectional shape, and it is directed to a light entrance surface of an optical integrator 206 such as a fly's eye lens, for example.

The fly's eye lens 206 comprises a number of small lenses, and a secondary light source having a two-dimensional distribution of a plurality of light source portions (light spots) is formed in the vicinity of its light exit surface. Denoted at 207 is a condenser lens which serves to irradiate a masking blade 209 in a Koehler illumination manner, with the light from the secondary light source as defined by the fly's eye lens 206.

The masking blade 209 and a reticle (mask) 212 are placed in an optically conjugate relationship with respect to an imaging optical system 210 and a mirror 211, such that, by adjusting the size and shape of the opening of the masking blade 209 (i.e., field stop), the size and shape of the illumination region on the reticle 212 to be illuminated with the illumination light is determined and adjusted.

The illumination region upon the reticle 212 has a slit-like shape, having a lengthwise direction extending in a direction perpendicular to the scan direction of the reticle and a wafer, and a widthwise direction extending along the scan direction.

Denoted at 213 is a projection optical system for projecting a circuit pattern, formed on the reticle 212, onto a wafer (semiconductor substrate) 214 in a reduced scale. Denoted at 216 is a control device for moving, in cooperation with an unshown driving mechanism, the reticle 212 and the wafer 214 exactly at a constant speed and at a ratio the same as the magnification of the projection optical system 213.

FIG. 2 is a schematic view for explaining the relationship between the disposition of arrayed small lenses of the fly's eye lens 206 of the scanning exposure apparatus of FIG. 1 with the scan direction of the reticle 212. In FIG. 2, the masking blade 209 and the imaging optical system 210 as well as the mirror 211 are not illustrated.

In FIG. 2, denoted at 212a is an illumination region on the reticle 212 and, as described, this illumination region 212a has a slit-like (oblong) shape having a widthwise direction along the scan direction of the reticle 212. The reticle 212 and the light entrance surface 206a of each small lens of the fly's eye lens 206 are optically conjugate with each other. The scan direction of the reticle 212 and one direction (X direction) of the array of the small lenses are in the same direction.

FIG. 3A is a plan view for explaining the relation among the light source portions (secondary light source) being provided by the small lenses of the fly's eye lens of FIG. 2, the illumination region 212a on the reticle 212 and the scan direction of the reticle 212. Denoted at 206b are light source portions as formed in the vicinity of the light exit surface of each small lens. These light source portions are arrayed two-dimensionally in accordance with the array of the small lenses.

When a scanning exposure process is performed by using light from the secondary light source as defined by the fly's eye lens 206, there occurs interference among the lights from the light source portions of the secondary light source. This produces an interference fringe on the reticle 212 and the wafer 214.

FIG. 3B illustrates an interference fringe (exposure non-uniformness) produced by pulse light from the excimer laser 301. As seen in the drawing, a interference fringe like a grid is being produced. Of two orthogonal directions of the grid in which the intensity changes periodically, one is in the same direction as the reticle scan direction. The other direction is perpendicular to the scan direction. Thus, with the scanning exposure process, the interference fringe is smoothed in the scan direction (X direction), whereas in the direction (Y direction) perpendicular to the scan direction the interference fringe is not smoothed but remains such as illustrated in FIG. 3C. This results in exposure non-uniformness.

SUMMARY OF THE INVENTION

It is an object of the present invention to provide a scanning exposure apparatus by which such exposure non-uniformness is reduced significantly.

It is another object of the present invention to provide a device manufacturing method using such a scanning exposure apparatus.

In accordance with an aspect of the present invention, there is provided a scanning system, comprising: illuminating means for illuminating an object with coherent illumination light; and scanning means for relatively and scanningly moving the object relative to the illumination light, along a scan direction, wherein said illuminating means is arranged so that a direction of interference fringe to be produced on the object by the illumination light is inclined with respect to the scan direction.

In accordance with another aspect of the present invention, there is provided a scanning exposure apparatus, comprising: illuminating means for illuminating a mask with coherent illumination light and for exposing a substrate with the illumination light coming from the mask; and scanning means for relatively and scanningly moving the mask and the substrate relative to the illumination light, along a scan direction, wherein said illuminating means is arranged so that a direction of interference fringe to be produced on the substrate by the illumination light is inclined with respect to the scan direction.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 4:
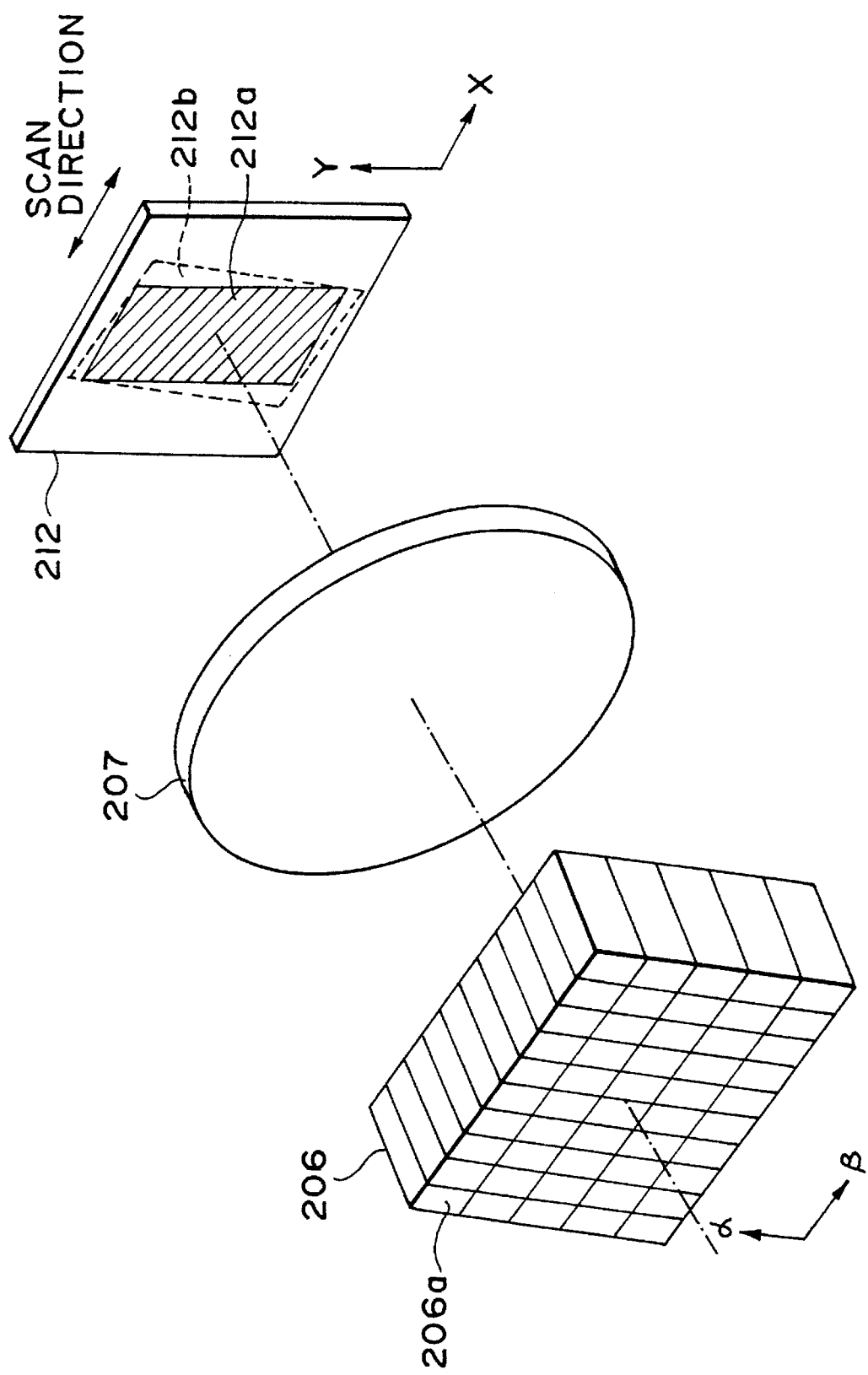
FIG. 4 is an enlarged schematic view of a main portion of a scanning exposure apparatus according to an embodiment of the present invention.

FIG. 4 is a schematic view of a main portion of one embodiment of the present invention. The scanning exposure apparatus of this embodiment has substantially the same structure as that of FIG. 1, except the point of disposition of a fly's eye lens 206 which will be described with reference to FIGS. 4 and 5.

More specifically, referring back to FIG. 1, the scanning exposure apparatus according to this embodiment comprises an excimer laser 301. Light emitted by the excimer laser is shaped by a beam shaping optical system 302 into light of a suitable size and shape in section. The light is then projected on a light entrance surface of a fly's eye lens 206. The fly's eye lens 206 serves to form a secondary light source having two-dimensionally distributed light source portions (light spots). Condenser lens 207 irradiates a masking blade 209 in a Koehler illumination manner with the light from the secondary light source. With this masking blade 209 and an imaging optical system 210, a reticle (mask) 212 is illuminated by slit-like illumination light having a lengthwise direction extending perpendicular to the scan direction of the reticle and wafer and a widthwise direction extending along the scan direction. Thus, a circuit pattern formed on the reticle 212 is projected by a projection optical system 213 onto a wafer (semiconductor substrate) 214 in a reduced scale. By means of a control device 216 and unshown driving mechanisms, the reticle 212 and the wafer 214 are moved exactly at a constant speed and at a ratio the same as the magnification of the projection optical system 213. By this, the wafer 214 is scanningly exposed.

In this embodiment, as illustrated in FIG. 4, the fly's eye lens 206 is placed with rotation (tilt) by an angle θ about a rotational axis (optical axis) from its normal state such that the direction of array of the small lenses of the fly's eye lens 206 is out of registration with the scan direction. Thus, the fly's eye lens 206 serves to define a secondary light source having an array of light source portions (light spots) juxtaposed in a direction α, intersecting the scan direction, and having an array of light source portions (light spots) juxtaposed in a direction β, being deviated by an angle θ from the scan direction. In other words, there is provided a secondary light source which comprises a plurality of two-dimensionally distributed light source portions, being juxtaposed substantially off the scan direction (X direction).

Figure 1:
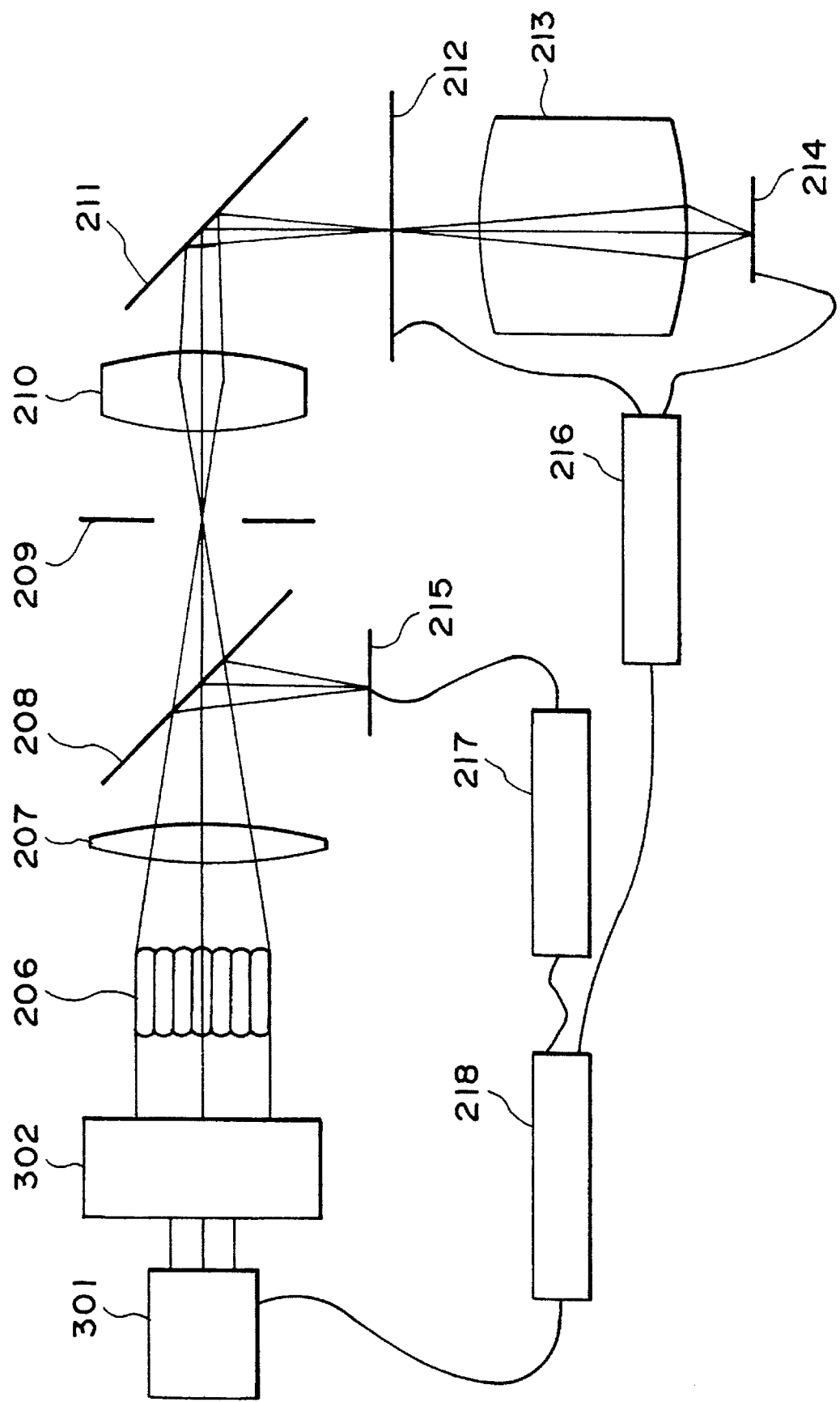
FIG. 1 is a schematic view for explaining a general concept of a scanning exposure apparatus.
Figure 2:
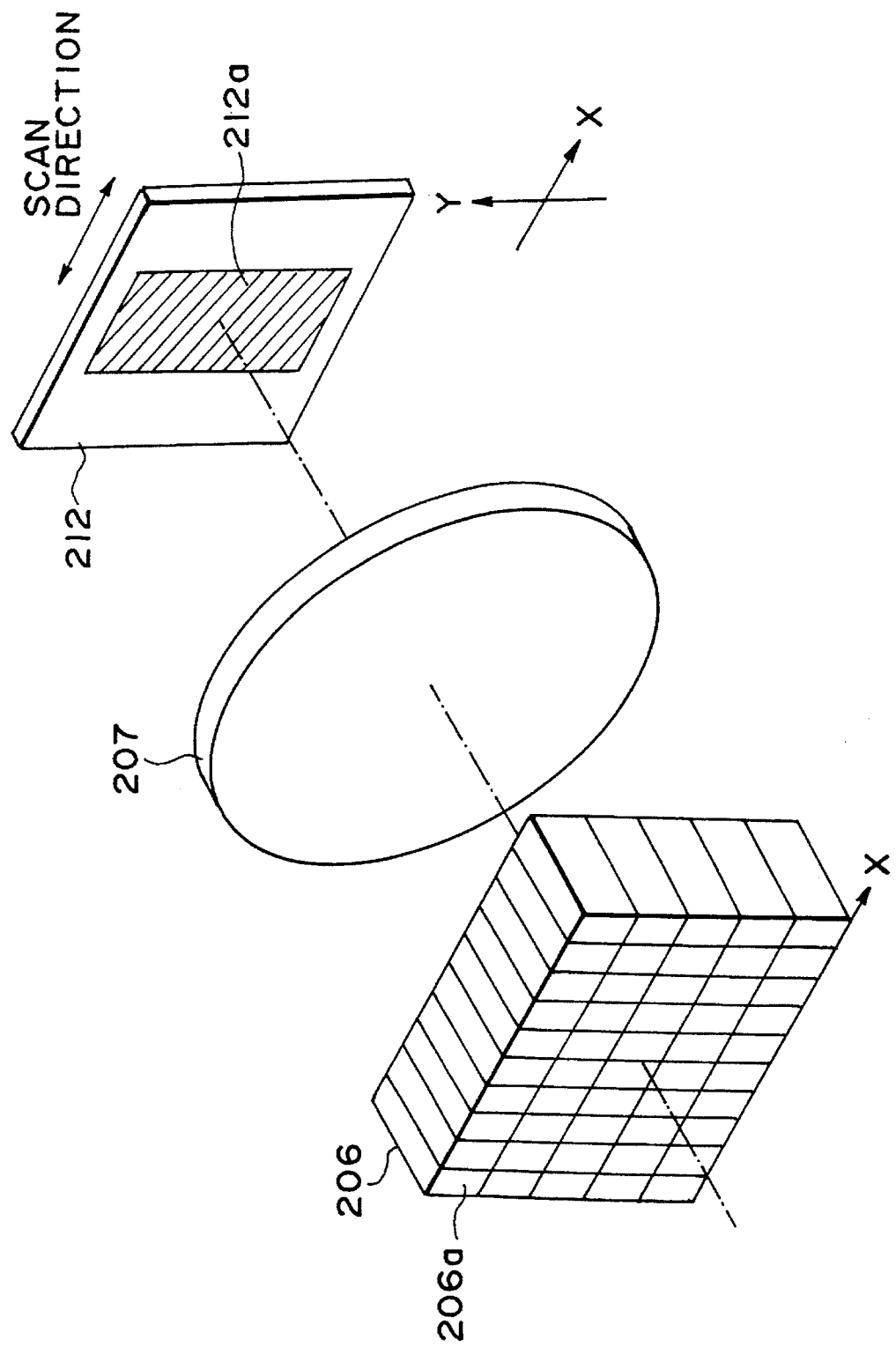
FIG. 2 is an enlarged schematic view for explaining the disposition of a fly's eye lens of the scanning exposure apparatus of FIG. 1.

The region shown in FIG. 4 by hatching and the region enclosed by a broken line correspond to an illumination region 212a defined by the fly's eye lens of FIG. 1 and an illumination region 212b defined by the fly's eye lens of the present embodiment, respectively, both in cases not regulated by the masking blade 209.

Figure 5A:
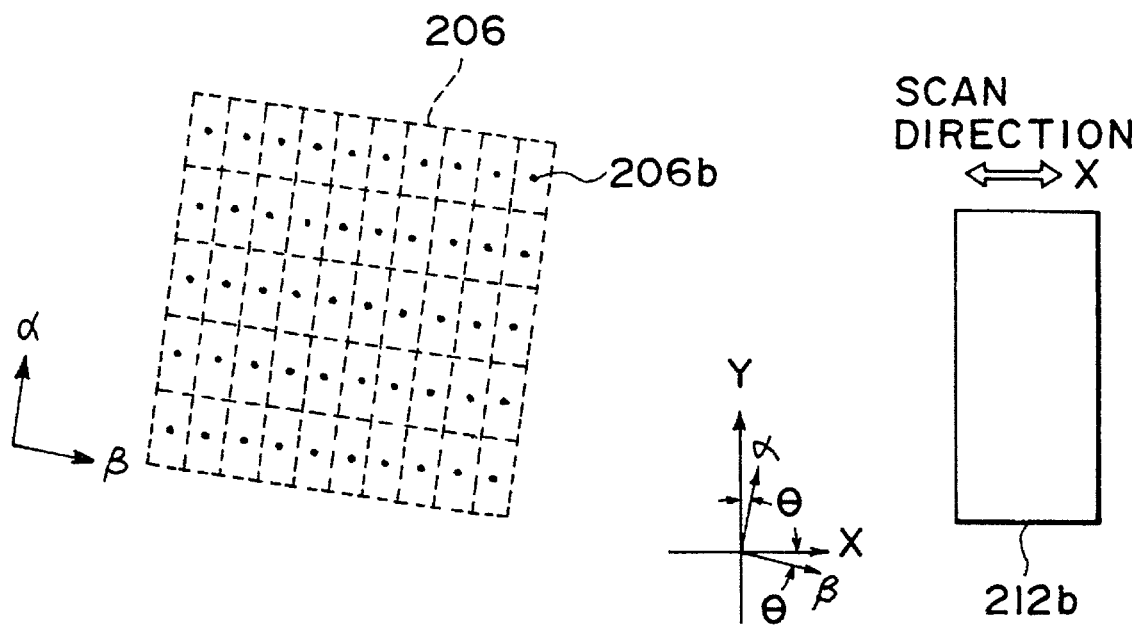
FIGS. 5A and 5B are schematic views for explaining the disposition of a fly's eye lens of the FIG. 4 embodiment as well as how exposure non-uniformness is reduced in this embodiment.

FIG. 5A illustrates directions α and β of the array of the small lenses of the fly's eye lens of this embodiment and the illumination region 212b defined thereby upon the reticle 212, as well as the scan direction X of the reticle 212.

Figure 3A:
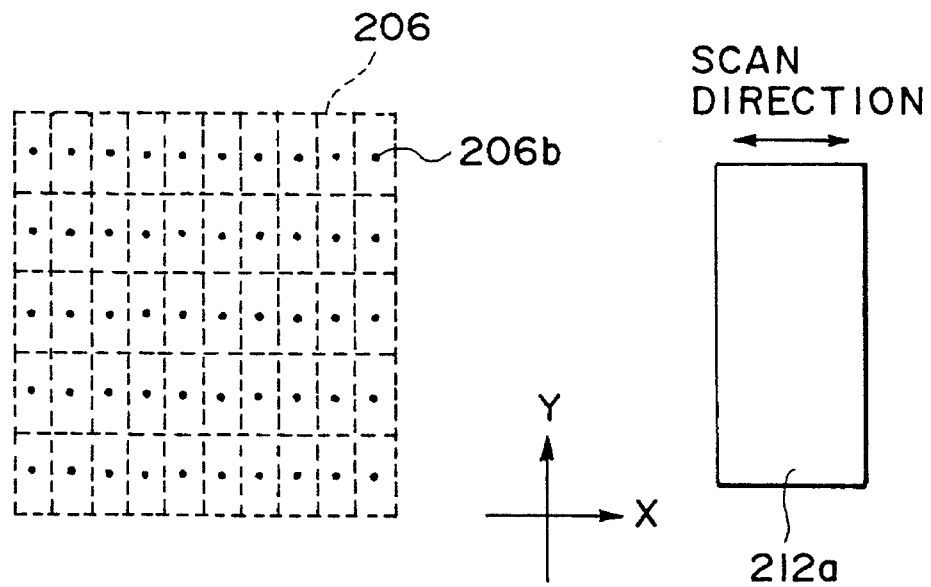
FIGS. 3A–3C are schematic views, respectively, for explaining how exposure non-uniformness occurs in the scanning exposure apparatus of FIG. 1.
Figure 3B:
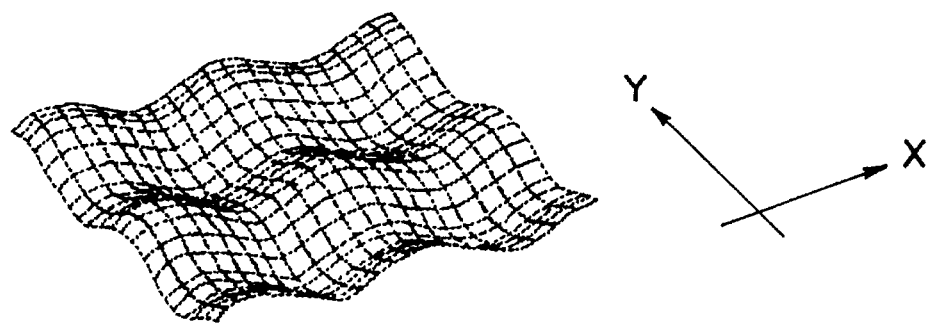
Figure 3C:
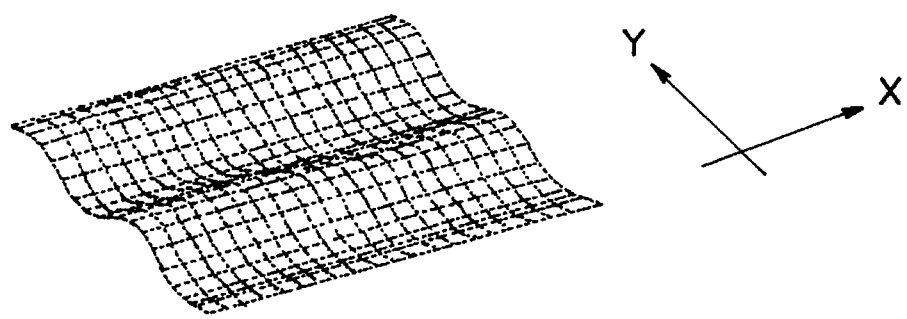

In FIG. 5A, denoted at 206b are light source portions (light spots of laser light defined by the small lenses) as formed in the vicinity of the light exit surfaces of the small lenses. These light source portions are formed in accordance with the array of the small lenses. Upon the reticle 212 and the wafer 214, an interference fringe is formed due to interference of lights from the light source portions of this secondary light source. Here, the interference fringe as formed in response to one pulse light will be like a grid such as shown in FIG. 3B. However, according to this embodiment, the directions α and β of the array of the light source portions formed in the vicinity of the light exit surface of the fly's eye lens 206 are off the scan direction, more particularly, not intersecting perpendicularly with the scan direction but are inclined with respect to the scan direction. As a result, the direction of produced interference fringe is in the direction of α or β, and it does not extend along the scan direction of the reticle 212. Thus, it does not intersect perpendicularly with the scan direction but is inclined with respect to the scan direction.

Figure 5B:
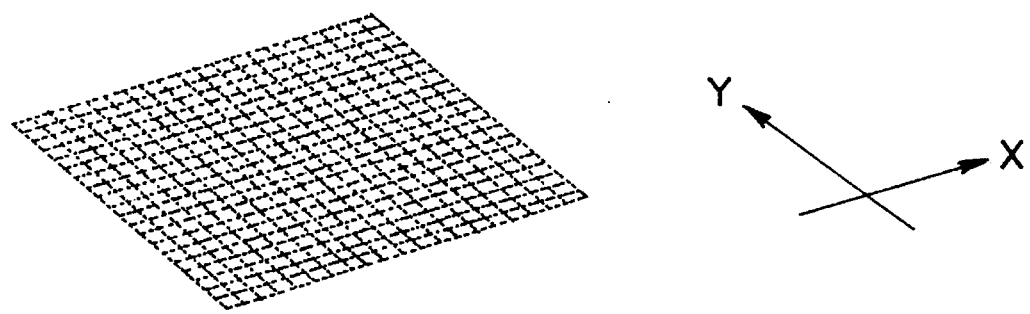

As a result of this, as the scanning exposure is performed along the X direction, the interference fringe is smoothed, such as illustrated in FIG. 5B, in the X direction (scan direction) as well as in the Y direction perpendicular to the scan direction. In this embodiment, therefore, the scanning exposure is performed with minimized exposure non-uniformness.

Figure 6A:
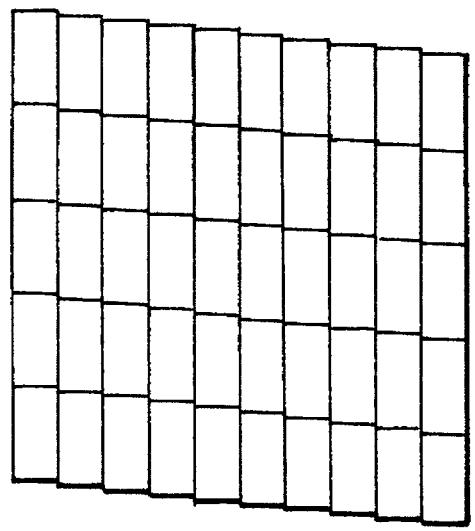
FIGS. 6A and 6B are schematic views for explaining modified forms of the fly's eye lens of the FIG. 4 embodiment.
Figure 6A:
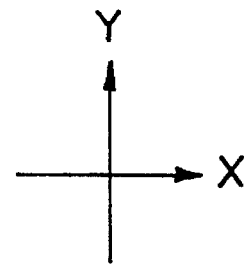
Figure 6B:
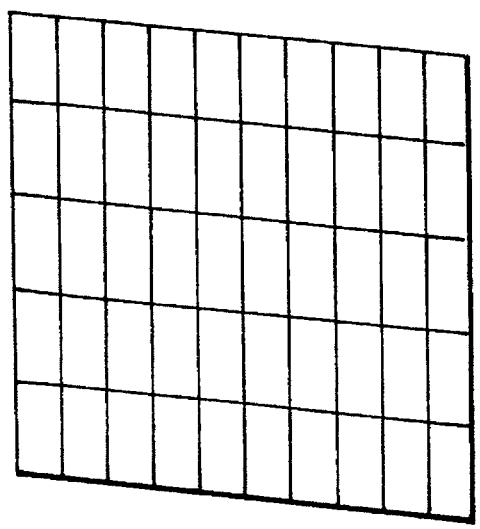
Figure 6B:
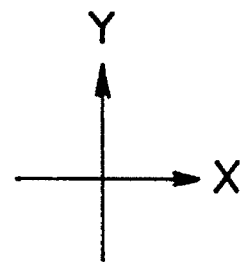

In this embodiment, as described, an ordinary fly's eye lens such as at 206, comprising orthogonally arrayed small lenses, is disposed with rotation by an angle θ deg. about the optical axis to thereby provide deviation of the array directions of the light source portions of the secondary light source from the scan direction X of the reticle 212 and the wafer 214. However, the small lenses of the fly's eye lens may be so arrayed as illustrated in FIGS. 6A or 6B, by which the array directions of the light source portions of the secondary light source may extend off the scan direction X of the reticle 212 and the wafer 214.

Figure 7:
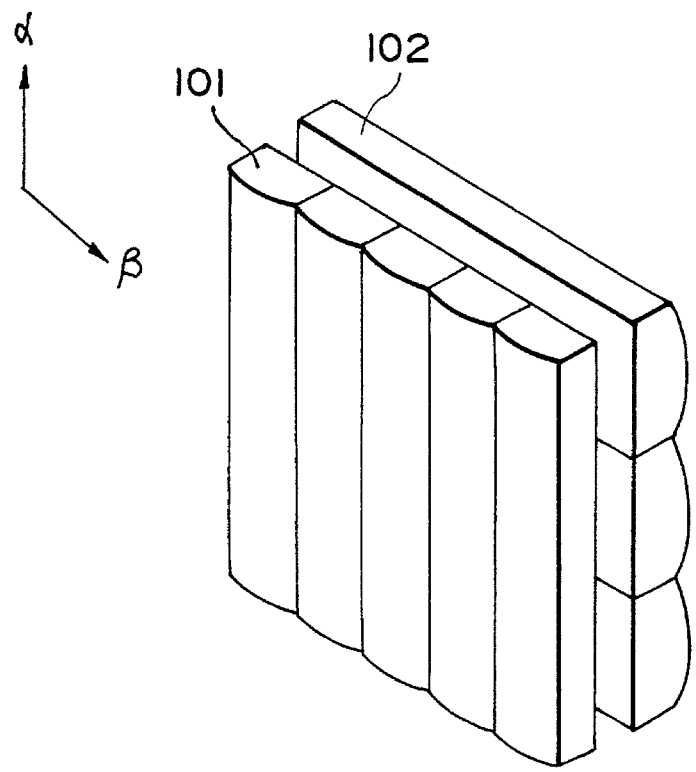
FIG. 7 is a schematic view of a main constituent of a scanning exposure apparatus according to another embodiment of the present invention.

A possible alternative is illustrated in FIG. 7 wherein, in place of the fly's eye lens 206, a first lens array (lenticular lens) 101 which comprises cylindrical lenses arrayed along the direction α and a second lens array (lenticular lens) 102 which comprises cylindrical lenses arrayed along the direction β, may be used in combination. On that occasion, the first and second lens arrays may be disposed and juxtaposed along the path of the laser light.

Figure 8:
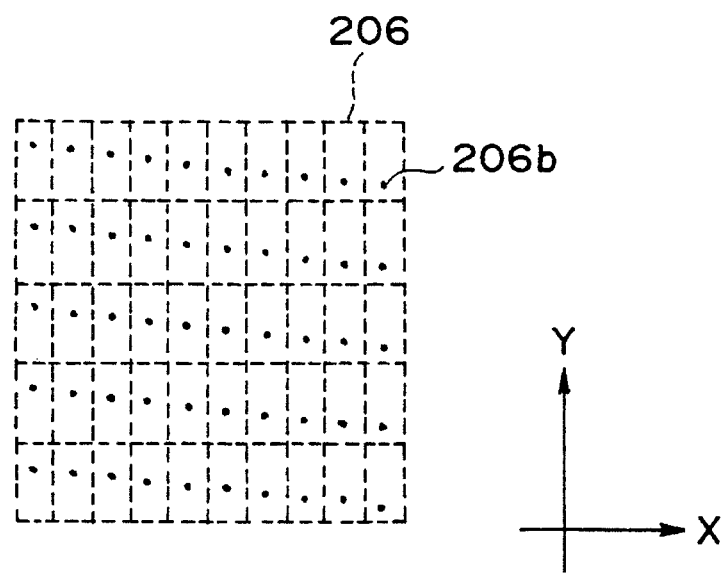
FIG. 8 is a schematic view for explaining a further embodiment of the present invention.

A further alternative is illustrated in FIG. 8 wherein the fly's eye lens 206 itself is disposed as in the case of FIG. 1 (i.e., without rotation). In place of it, an incidence angle controlling member (not shown) is used to change, with respect to all the small lenses of the fly's eye lens, the angle of incidence of light impinging on each small lens, to thereby provide a deviation of the directions of an array of the light source portions of the secondary light source from the scan direction X of the reticle 212 and the wafer 214. With this arrangement, the lengthwise direction of the illumination light intersects with the scan direction perpendicularly such that illumination of good efficiency as in the FIG. 1 arrangement is assured.

In some embodiments described hereinbefore, the directions α and β of an array of plural light source portions of a secondary light source, as formed in the vicinity of the light exit surface of an optical integrator such as fly's eye lens 206, are defined off the scan direction X of the reticle 212 and the wafer 214. By performing the scanning exposure in this state, the exposure non-uniformness is minimized.

The reduction of non-uniformness of exposure is attributable to that: the direction of an array of an effective light source (plural light source portions), as viewed from the wafer 214 surface side, is off the scan direction of the reticle and the wafer 214, and the scanning exposure process is performed under the condition that the direction of interference fringe produced on the wafer 214 surface by one light pulse (or at a certain moment) is inclined with respect to the scan direction, by which the interference fringe is smoothed.

As regards the angle of inclination of the direction of interference fringe to the scan direction, an appropriate angle that does not cause mutual strengthening of the interference fringe during the scanning exposure, may be selected. For example, if the pitch of interference fringe produced on the wafer 214 surface in a direction perpendicular to the scan direction is A, and the width of the illumination light upon the wafer 214 surface and in the scan direction is B, then the inclination angle θ of the direction of the interference fringe to the scan direction should idealistically satisfy the following condition:

$$\sin\theta = A/B. \tag{1}$$

However, the condition for cancelling the produced interference fringe with a plurality of pulse lights is not limited to the above. For example, if the number of exposure pulses necessary for exposure of one zone is N, a condition:

$$\sin\theta = (N-1) \times (A/B). \tag{2}$$

may be selected with regard to the angle θ, with substantially the same smoothing effect as obtained by equation (1). Further, a similar smoothing effect may be obtained if an angle θ which is within the following range is selected:

$$A/B \leq \sin\theta < (N-1) \times (A/B). \tag{3}$$

If, on the other hand, an angle θ that satisfies $\sin\theta = N \times (A/B)$ is selected, a smoothing effect of plural light pulses may not be obtainable.

It is therefore desirable to select an inclination angle θ of interference fringe to the scan direction, which is within the following range:

$$A/B \leq \sin\theta \leq (M-1) \times (A/B). \tag{4}$$

wherein M is the smallest number of exposure pulses set in the exposure apparatus, which number corresponds to the lower limit of the pulse number as required for the scanning exposure of one site on the wafer 214.

On an occasion when an exposure light source of a continuous emission type, such as a He-Ne laser, is used, the inclination angle θ of the interference fringe to the scan direction should satisfy:

$$\sin\theta \geq A/B. \tag{5}$$

If this condition is satisfied, a smoothing effect is assured.

Next, an embodiment of a device manufacturing method which uses a scanning exposure apparatus according to any one of the embodiments described with reference to FIGS. 4–8, will be explained.

Figure 9:
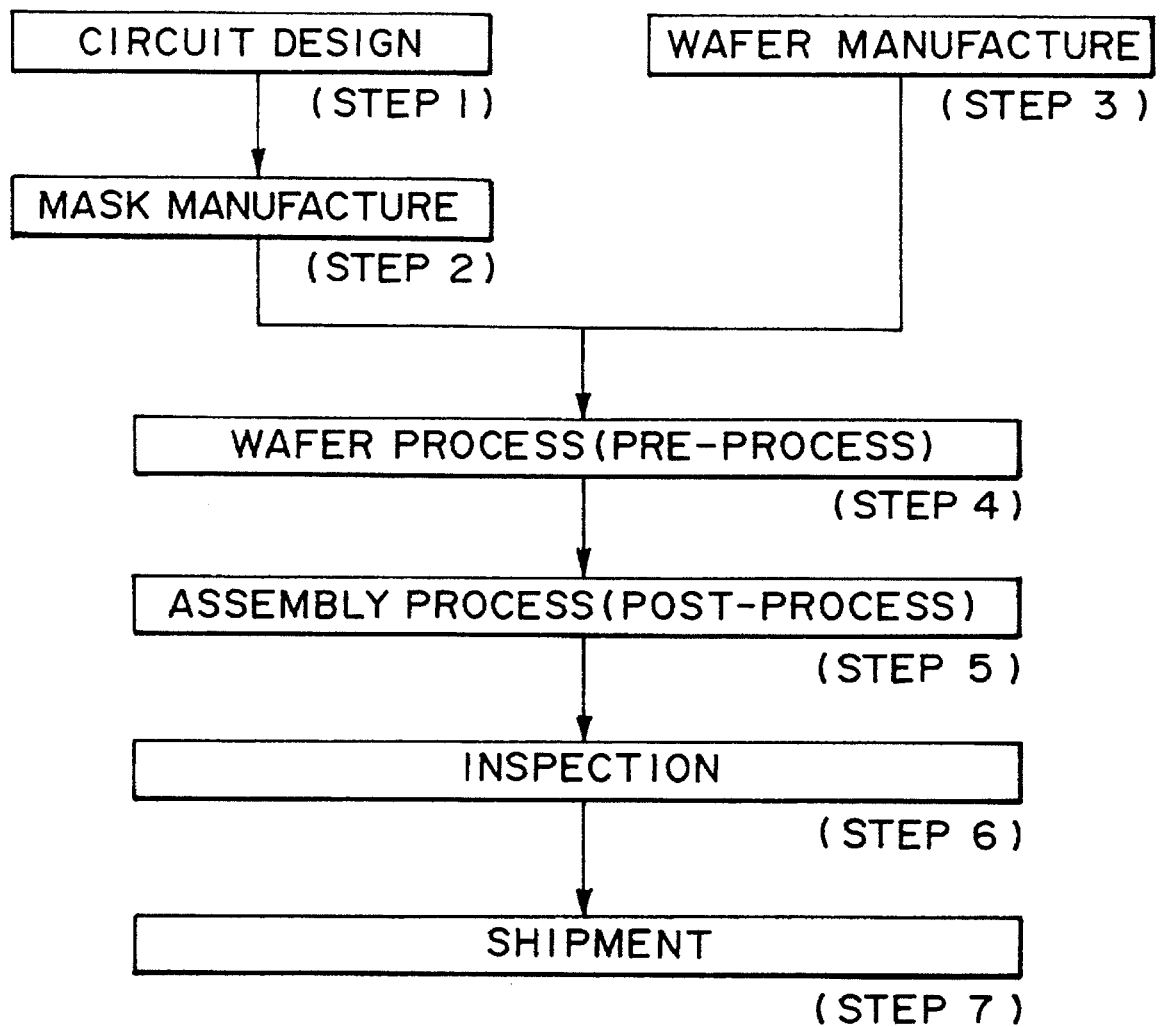
FIG. 9 is a flow chart of device manufacturing processes.

FIG. 9 is a flow chart of the sequence of manufacturing microdevices such as a semiconductor chip (e.g., IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 10:
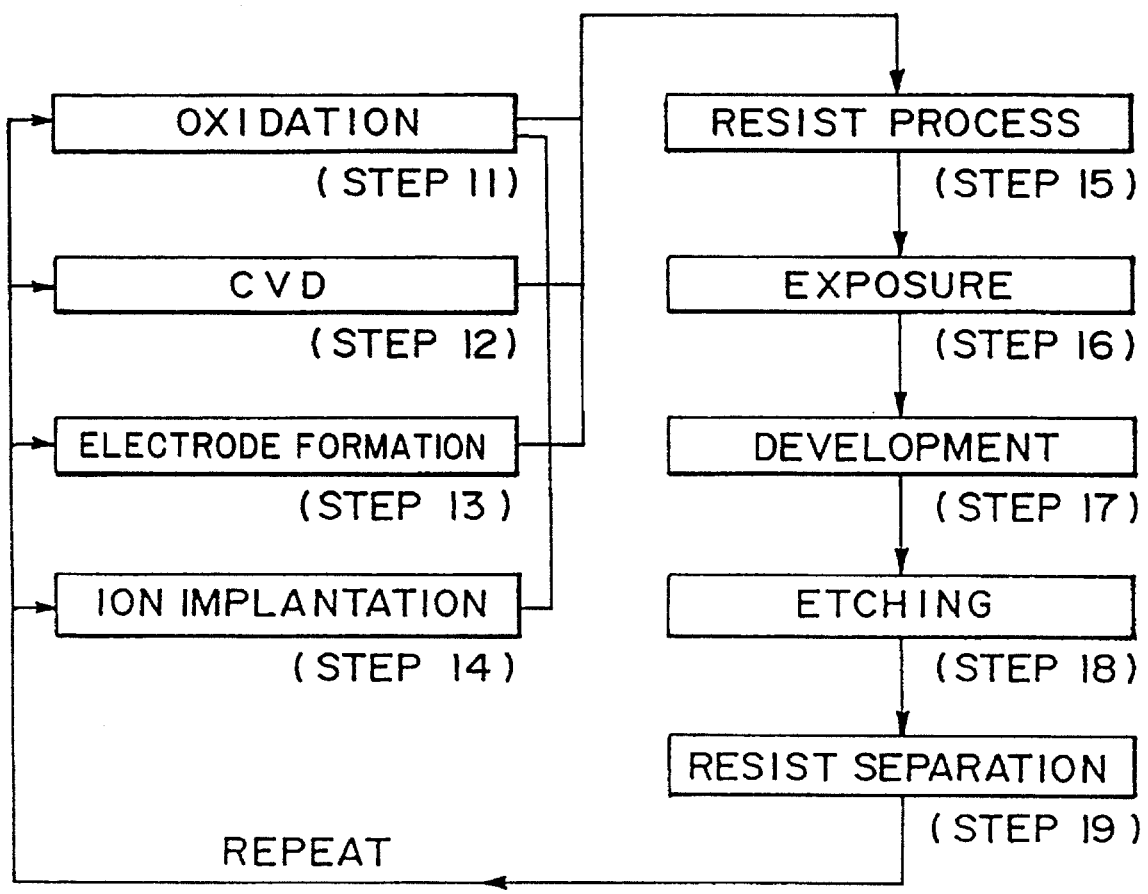
FIG. 10 is a flow chart of a wafer process included in the flow chart of FIG. 9.

FIG. 10 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A scanning system, comprising:

illuminating means for illuminating an object with coherent illumination light; and scanning means for relatively and scanningly moving the object relative to the illumination light, along a scan direction, wherein said illuminating means is arranged so that a direction of interference fringe to be produced on the object by the illumination light is inclined with respect to the scan direction.

2. A system according to claim 1, wherein, where the angle of inclination of the direction of interference fringe with respect to the scan direction is θ, the pitch of the interference fringe is A and the width of the illumination light in the scan direction is B, the following condition is satisfied:

$$A/B \leq \sin\theta.$$

3. A system according to claim 1, wherein said illuminating means includes a light source for providing coherent light, and secondary light source forming means for forming a plurality of light source portions distributed two-dimensionally along different two directions, wherein the illumination light is provided by said light source portions and wherein said light source portions are arrayed so that the interference fringe is inclined with respect to the scan direction.

4. A system according to claim 3, wherein said secondary light source forming means includes a fly's eye lens for receiving the coherent light, and wherein said fly's eye lens comprises a plurality of lens elements arrayed two-dimensionally along two different directions.

5. A system according to claim 4, wherein said two directions along which said lens elements are arrayed are perpendicular to each other, and wherein said two directions along which said lens elements are arrayed are inclined with respect to the scan direction.

6. A system according to claim 4, wherein one of said two directions along which said lens elements are arrayed is orthogonal to the scan direction, and wherein the other of said two directions is inclined with respect to the scan direction.

7. A system according to claim 4, wherein each lens element of said fly's eye lens has an oblong sectional shape.

8. A system according to claim 4, wherein each lens element of said fly's eye lens has a sectional shape of a parallelogram.

9. A system according to claim 3, wherein said secondary light source forming means includes a pair of lenticular lenses for sequentially receiving the coherent light, wherein said pair of lenticular lenses have generating lines extending perpendicular to each other, and wherein the directions of generating lines of said pair of lenticular lenses are inclined with respect to the scan direction.

10. A scanning exposure apparatus, comprising:
   illuminating means for illuminating a mask with coherent illumination light and for exposing a substrate with the illumination light coming from the mask; and
   scanning means for relatively and scanningly moving the mask and the substrate relative to the illumination light, along a scan direction, wherein said illuminating means is arranged so that a direction of interference fringe to be produced on the substrate by the illumination light is inclined with respect to the scan direction.

11. An apparatus according to claim 10, wherein, where the angle of inclination of the direction of interference fringe with respect to the scan direction is θ, the pitch of the interference fringe is A and the width of the illumination light in the scan direction is B, the following condition is satisfied:

$$A/B \leq \sin\theta.$$

12. An apparatus according to claim 10, wherein said illuminating means includes a light source for providing coherent light, and secondary light source forming means for forming a plurality of light source portions distributed two-dimensionally along different two directions, wherein the illumination light is provided by said light source portions and wherein said light source portions are arrayed so that the interference fringe is inclined with respect to the scan direction.

13. An apparatus according to claim 12, wherein said secondary light source forming means includes a fly's eye lens for receiving the coherent light, and wherein said fly's eye lens comprises a plurality of lens elements arrayed two-dimensionally along two different directions.

14. An apparatus according to claim 13, wherein said two directions along which said lens elements are arrayed are perpendicular to each other, and wherein said two directions along which said lens elements are arrayed are inclined with respect to the scan direction.

15. An apparatus according to claim 13, wherein one of said two directions along which said lens elements are arrayed is orthogonal to the scan direction, and wherein the other of said two directions is inclined with respect to the scan direction.

16. An apparatus according to claim 13, wherein each lens element of said fly's eye lens has an oblong sectional shape.

17. An apparatus according to claim 13, wherein each lens element of said fly's eye lens has a sectional shape of a parallelogram.

18. An apparatus according to claim 16, wherein said secondary light source forming means includes a pair of lenticular lenses for sequentially receiving the coherent light, wherein said pair of lenticular lenses have generating lines extending perpendicular to each other, and wherein the directions of generating lines of said pair of lenticular lenses are inclined with respect to the scan direction.

19. A device manufacturing method which includes a step of printing a device pattern on a substrate by use of a scanning exposure apparatus as recited in any one of claims 10–18.

* * * * *

UNITED STATES PATENT AND TRADEMARK OFFICE
CERTIFICATE OF CORRECTION

PATENT NO. : 5,621,499
DATED : April 15, 1997
INVENTOR(S) : Takahisa SHIOZAWA

It is certified that error appears in the above-indentified patent and that said Letters Patent is hereby corrected as shown below:

COLUMN 2:

Line 18, "a" should read --an--.

Signed and Sealed this

Twenty-third Day of September, 1997

Attest:

BRUCE LEHMAN

Attesting Officer      Commissioner of Patents and Trademarks